United States Patent
Lee et al.

(10) Patent No.: US 7,741,984 B2
(45) Date of Patent: Jun. 22, 2010

(54) TRACK AND HOLD AMPLIFIERS AND ANALOG TO DIGITAL CONVERTERS

(75) Inventors: Zwei-Mei Lee, Taoyuan County (TW);
Kang-Wei Hsueh, Hsinchu (TW);
Ya-Lun Yang, Hsinchu County (TW);
Hung-Sung Li, Hsinchu County (TW);
Pao-Cheng Chiu, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/236,755

(22) Filed: Sep. 24, 2008

(65) Prior Publication Data
US 2010/0073209 A1    Mar. 25, 2010

(51) Int. Cl.
*H03M 1/00* (2006.01)

(52) U.S. Cl. .............. 341/122; 341/155; 341/172; 327/94

(58) Field of Classification Search ............ 341/122, 341/172
See application file for complete search history.

(56) References Cited

U.S. PATENT DOCUMENTS 6,529,049 B2 * 3/2003 Erhart et al. ............... 327/94
7,161,512 B1 * 1/2007 Keskin ....................... 341/118

* cited by examiner

*Primary Examiner*—Khai M Nguyen
(74) *Attorney, Agent, or Firm*—Thomas, Kayden, Horstemeyer & Risley

(57) ABSTRACT

A track and hold amplifier is provided. The track and hold amplifier includes an input node receiving an analog signal, a buffer coupled between a first node and an output node, a first switch coupled between the input node and the first node, a plurality of switching circuits and a voltage generating unit. Each of the switching circuits includes a capacitor coupled between the first node and a second node. The voltage generating unit selectively provides a common signal and a reference signal to the capacitors of the switching circuits, wherein the reference signal is independent from the analog signal and the common signal.

27 Claims, 6 Drawing Sheets

TRACK AND HOLD AMPLIFIERS AND ANALOG TO DIGITAL CONVERTERS

BACKGROUND OF THE INVENTION

1. Field of the Invention

The invention relates to a track and hold amplifier, and more particularly to an analog to digital converter with a front-end track and hold amplifier.

2. Description of the Related Art

Currently, analog to digital (A/D) converters are widely used in a variety of applications, such as medical systems, audio systems, test and measurement equipment, communication systems, and image and video systems, etc.

A track and hold amplifier is often considered the front-end of an A/D converter. The ideal purpose of the track and hold amplifier is to track an analog input signal and, at specified times, to hold that signal at its output until the held signal is received by other circuits of the A/D converter, such that the A/D converter can accurately convert the analog input signal to a digital signal. However, in fact, an inherent nonlinearity of an amplifier or a buffer that is used in the track and hold amplifier will degrade the resolution of the A/D converter such that the digital signal can not accurately represent the analog input signal.

Thus, calibrating nonlinearity of a track and hold amplifier in an A/D converter is desired.

BRIEF SUMMARY OF THE INVENTION

Track and hold amplifiers and analog to digital converters are provided. An exemplary embodiment of such a track and hold amplifier comprises an input node receiving an analog signal, a buffer coupled between a first node and an output node, a first switch coupled between the input node and the first node, a plurality of switching circuits and a voltage generating unit. Each of the switching circuits comprises a capacitor coupled between the first node and a second node. The voltage generating unit selectively provides a common signal and a reference signal to the capacitors of the switching circuits, wherein the reference signal is independent from the analog signal and the common signal.

Furthermore, another exemplary embodiment of a track and hold amplifier comprises an input node receiving an analog signal, an amplifier having a non-inverting input node coupled to a common node, an inverting input node and an output node, a first switch coupled between the inverting input and the common node, a plurality of switching circuits and a voltage generating unit coupled to the third switch of each of the switching circuits. Each of the switching circuits comprises a capacitor coupled between the inverting input node and a first node, a second switch coupled between the first node and the input node, a third switch coupled to the first node and a fourth switch coupled between the first node and the output node. The third switch and the fourth switch are synchronous. The third switch is turned off and the second switch is turned on when the first switch is turned on, and the first switch and the second switch are turned off when the third switch is turned on. The voltage generating unit selectively provides a common signal and a reference signal to the third switches of the switching circuits, wherein the reference signal is independent from the analog signal and the common signal.

Moreover, an exemplary embodiment of an analog to digital converter for converting an input signal to an output signal comprises a track and hold amplifier receiving the input signal to generate a sampled signal, a quantizer quantizing the sampled signal to generate a quantized signal, and a calibration processor calibrating the quantized signal to generate the output signal. The track and hold amplifier comprises an input node receiving the input signal, a buffer coupled between a first node and an output node, a first switch coupled between the input node and the first node, a plurality of switching circuits and a voltage generating unit coupled to the third switch of each of the switching circuits. Each of the switching circuits comprises a capacitor coupled between the first node and a second node, a second switch coupled between the second node and a common node, and a third switch coupled to the second node. The second switch is turned on and the third switch is turned off when the first switch is turned on, and the first switch and the second switch are turned off when the third switch is turned on. The voltage generating unit selectively provides a common signal and a reference signal to the third switches of the switching circuits, wherein the reference signal is independent from the analog signal and the common signal.

Furthermore, another exemplary embodiment of an analog to digital converter for converting an input signal to an output signal comprises a track and hold amplifier receiving the input signal to generate a sampled signal, a quantizer quantizing the sampled signal to generate a quantized signal, and a calibration processor calibrating the quantized signal to generate the output signal. The track and hold amplifier comprises an input node receiving the analog signal, an amplifier having a non-inverting input node coupled to a common node, an inverting input node and an output node, a first switch coupled between the inverting input and the common node, a plurality of switching circuits and a voltage generating unit coupled to the third switch of each of the switching circuits. Each of the switching circuits comprises a capacitor coupled between the inverting input node and a first node, a second switch coupled between the first node and the input node, a third switch coupled to the first node, and a fourth switch coupled between the first node and the output node. The third switch and the fourth switch are synchronous. The third switch is turned off and the second switch is turned on when the first switch is turned on, and the first switch and the second switch are turned off when the third switch is turned on. The voltage generating unit selectively provides a common signal and a reference signal to the third switches of the switching circuits, wherein the reference signal is independent from the analog signal and the common signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
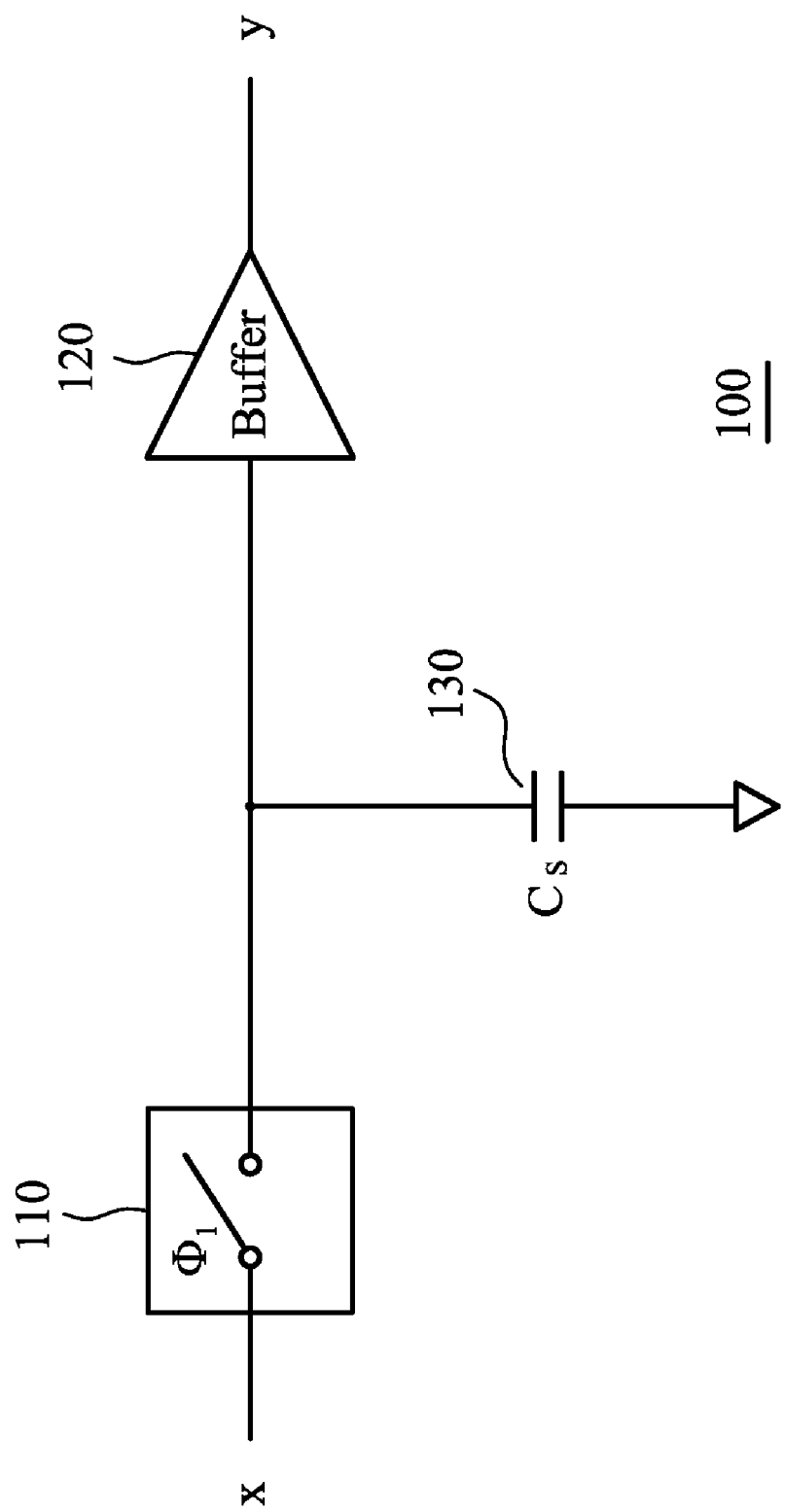
FIG. 1 shows a simple track and hold amplifier.

FIG. 1 shows a simple track and hold amplifier 100. The track and hold amplifier 100 comprises a switch 110, a buffer 120 and a capacitor 130, wherein the switch 110 is controlled by a signal $\phi_1$. During a track mode (i.e. the switch 110 is turned on), an analog input signal x is received by an input of the track and hold amplifier 100, and is then transferred to the capacitor 130 which is coupled to an input of the buffer 120. During a hold mode (i.e. the switch 110 is turned off), the capacitor 130 is de-coupled from the input of the track and hold amplifier 100 thereby holding a charged voltage across the capacitor 130. Then, an output signal y of the buffer 120 is transferred to the subsequent circuits of an analog to digital converter. In FIG. 1, a value of the capacitor 130 is $C_s$.

Figure 2:
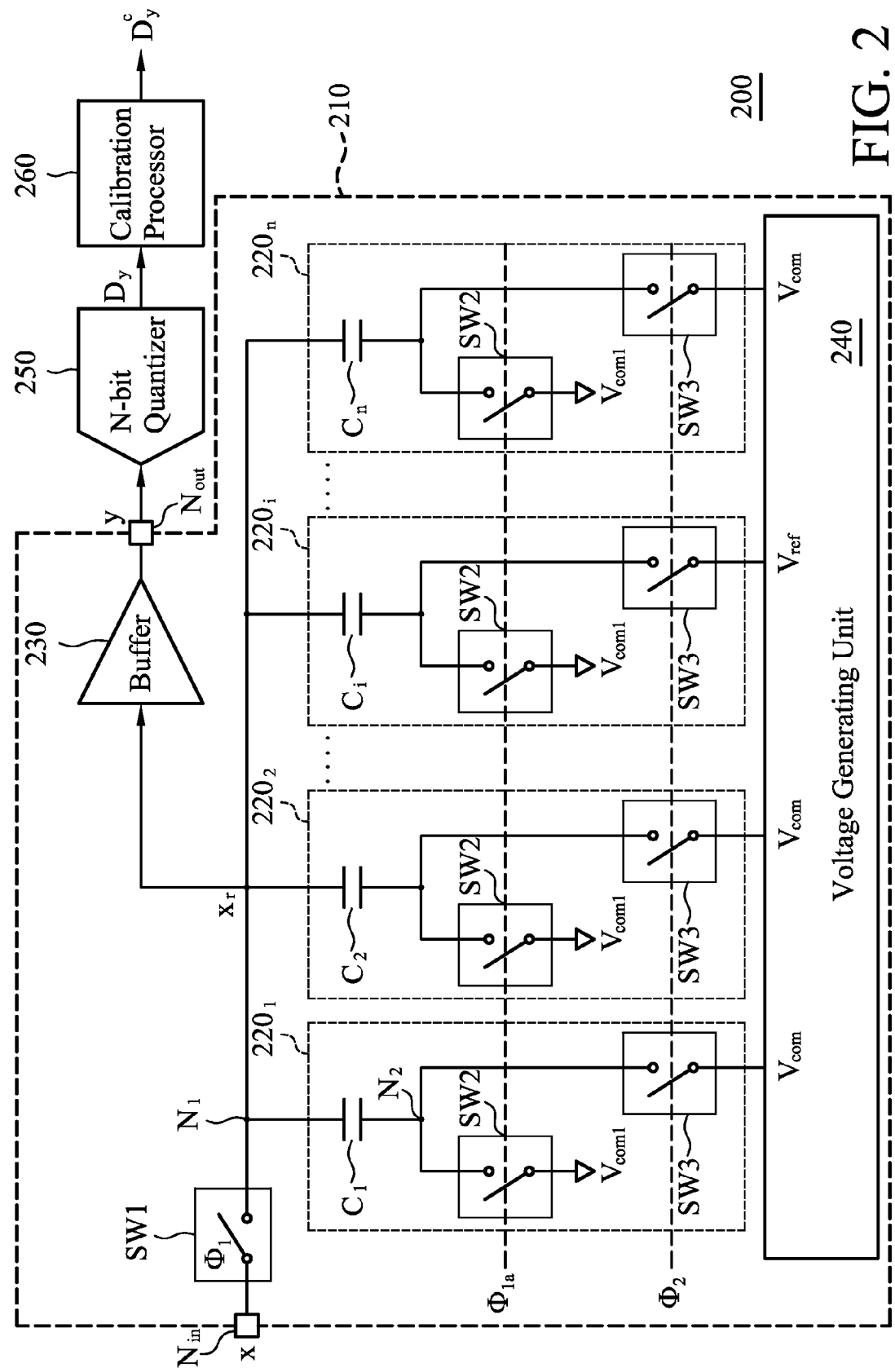
FIG. 2 shows an analog to digital converter according to an embodiment of the invention.

FIG. 2 shows an analog to digital converter 200 according to an embodiment of the invention. The analog to digital converter 200 comprises a track and hold amplifier 210, an N-bit quantizer 250 and a calibration processor 260. The track and hold amplifier 210 tracks and holds an analog input signal x to generate a sampled signal y. Next, the N-bit quantizer 250 quantizes the sampled signal y to generate an N-bit digital signal $D_y$. Finally, the calibration processor 260 receives the quantized signal $D_y$ and calibrates its nonlinearity caused by the track and hold amplifier 210 to generate a digital output signal $D_y^c$.

Figure 3A:
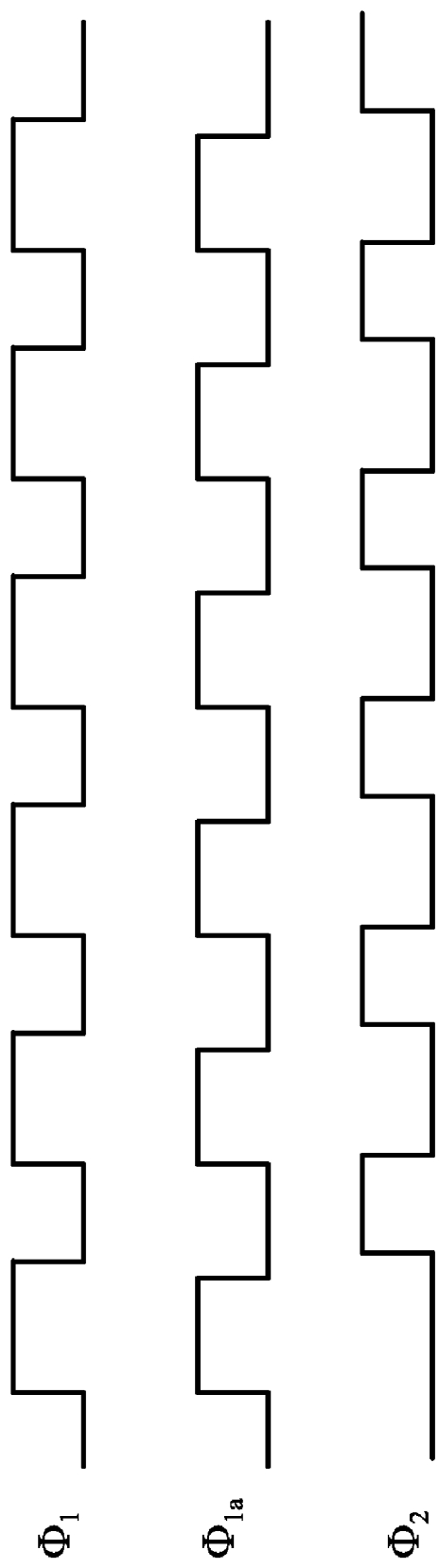
FIGS. 3A and 3B show the waveforms of the signals $\phi_1$, $\phi_{1a}$ and $\phi_2$.
Figure 3B:
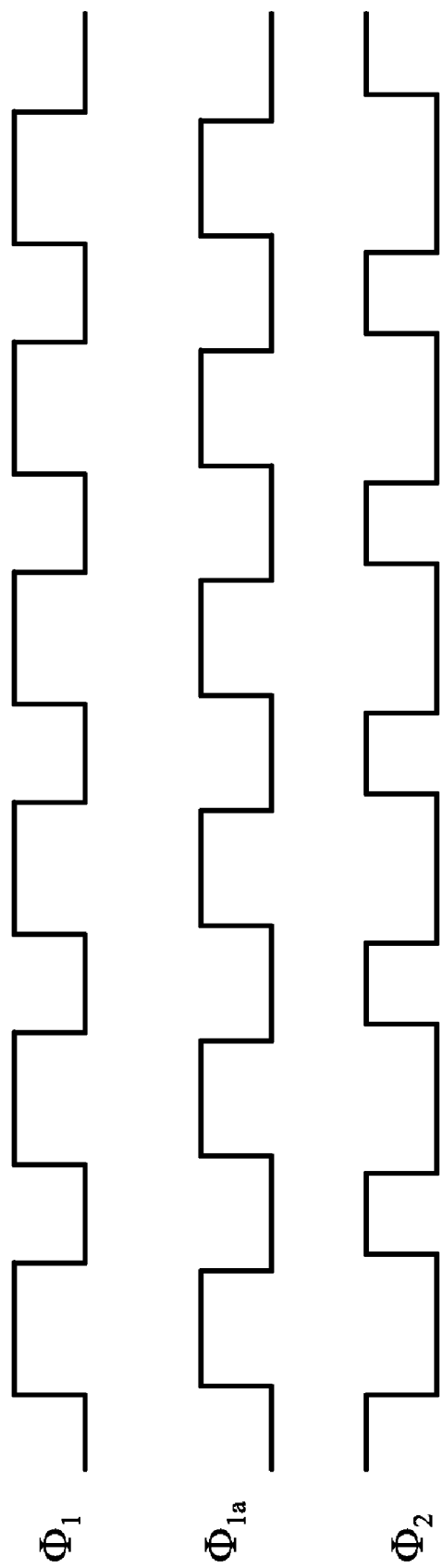

As shown in FIG. 2, the track and hold amplifier 210 is an open-loop circuit, which comprises a switch SW1, a plurality of switching circuits $220_1$-$220_n$, a buffer 230 and a voltage generating unit 240. The switch SW1 is coupled between an input node $N_{in}$ for receiving the analog input signal x and a node $N_1$, and the switch SW1 is controlled by a signal $\phi_1$. The buffer 230 is coupled between the node $N_1$ and an output node $N_{out}$. In some embodiments, the buffer 230 is an amplifier with gain. Each of the switching circuits $220_1$-$220_n$ is coupled between the node $N_1$ and the voltage generating unit 240. The switching circuits $220_1$-$220_n$ may have similar architectures and each switching circuit may comprise a capacitor and two switches. Using the switching circuit $220_1$ as an example, the switching circuit $220_1$ comprises a capacitor $C_1$ coupled between the node $N_1$ and a node $N_2$, a switch SW2 coupled between the node $N_2$ and a common node $V_{com1}$ and a switch SW3 coupled between the node $N_2$ and the voltage generating unit 240. The voltage generating unit 240 selectively provides a common signal $V_{com}$ and a reference signal $V_{ref}$ to the switching circuits $220_1$-$220_n$, wherein the reference signal $V_{ref}$ may be any signal independent from the analog input signal x and the common signal $V_{com}$. Furthermore, a voltage of the common signal $V_{com}$ may either be equal to a voltage provided by the common node $V_{com1}$ or not. Furthermore, in track and hold amplifier 210, each of the switches SW2 is controlled by a signal $\phi_{1a}$ and each of the switches SW3 is controlled by a signal $\phi_2$, wherein the switches SW2 and the switches SW3 are not turned on simultaneously. Refer to FIGS. 3A and 3B for the waveforms illustrating different embodiments of phase relation between the signals $\phi_1$, $\phi_{1a}$ and $\phi_2$, wherein the signals $\phi_{1a}$ and $\phi_2$ in FIG. 3B are non-overlap clock signals.

Referring to FIG. 2 and FIG. 3A together, when the signal $\phi_1$ is at a high level voltage (a track mode), the switches SW1 and SW2 are turned on and the switches SW3 are turned off. During the track mode, a signal $x_r$ of the node $N_1$ is equal to the analog input signal x. When the signal $\phi_2$ is at a high level voltage (a hold mode), the switches SW1 and SW2 are turned off and the switches SW3 are turned on. During the hold mode, the voltage generating unit 240 provides the reference signal $V_{ref}$ to the switching circuit $220_i$ and the common signal $V_{com}$ to the other switching circuits (i.e. the switching circuits $220_1$-$220_n$ except for the switching circuit $220_i$), as shown in FIG. 2, the signal $x_r$ may be calculated as the following equation (1):

$$x_r = x - V_{ref} \times \frac{C_i}{\sum_{k=1}^{n} C_k}. \tag{1}$$

Next, the signal $x_r$ may be rewritten as the following equation (2):

$$x_r = x - V_{ref} \times \frac{C_i}{\sum_{k=1}^{n} C_k} = x - q_1 \times R \times \frac{C_i}{\sum_{k=1}^{n} C_k} = x - q_1 - R_i, \tag{2}$$

where $q_1$ is a sequence independent from the analog input signal x, which may be binary-valued, R is a predetermined value and $$R_i = R \times \frac{C_i}{\sum_{k=1}^{n} C_k}.$$

Moreover, in this invention, a summing capacitor value of the capacitors $$\left(\sum_{k=1}^{n} C_k\right)$$

is equal to the value of the capacitor 130 ($C_s$) as shown in FIG. 1. In one embodiment, the capacitors C1-Cn may not have the same capacitances in order to obtain randomization to calibrate nonlinearity. For example, each capacitor may have one of the capacitances which are a unit capacitance $C_{unit}$ to the power of 2, i.e. $C_{unit}$, $C_{unit}^2$, $C_{unit}^4$ and so on. Next, the buffer 230 receives the signal $x_r$ to generate the sampled signal y. Because of the buffer 230 is nonlinear, the sampled signal y may be expressed as a polynomial shown in the following equation (3):

$$y = a_0 + a_1 \times x_r + a_2 \times x_r^2 + a_3 \times x_r^3 + \ldots \tag{3}$$

If input and output characteristics of the buffer 230 are monotonic, the signal $x_r$ may be expressed as the following equation (4):

$$x_r = b_0 + b_1 \times y + b_2 \times y^2 + b_3 \times y^3 + \ldots \tag{4}$$

Next, the N-bit quantizer 250 quantizes the sampled signal y to generate the N-bit digital signal $D_y$, and the calibration processor 260 calibrates the N-bit digital signal $D_y$ to generate the digital output signal $D_y^c$, which is an estimate of the signal $x_r$ in digital domain and may be expressed as the following equation (5):

$$D_y^c = \bar{b}_0 + \bar{b}_1 \times D_y + \bar{b}_2 \times D_y^2 + \bar{b}_3 \times D_y^3 + \ldots \tag{5}$$

Because the digital output signal $D_y^c$ closely approximates the signal $x_r$, the signal $x_r$ may be rewritten as the following equation (6) according to the equations (4) and (5):

$$x_r = D_y^c + (b_0 - \tilde{b}_0) + (b_1 - \tilde{b}_1) \times D_y + (b_2 - \tilde{b}_2) \times D_y^2 + (b_3 - \tilde{b}_3) \times D_y^3 + \ldots \quad (6).$$

Next, the expectation values of the both sides of the equation (6) correlated with the value q may be calculated as the following equation (7):

$$E\{q_2 \times x_r\} = E\{q_2 \times [D_y^c + (b_0 - \tilde{b}_0) + (b_1 - \tilde{b}_1) \times D_y + (b_2 - \tilde{b}_2) \times D_y^2 + (b_3 - \tilde{b}_3) \times D_y^3 + \ldots ]\} \quad (7).$$

where $q_2$ may have the same waveform as $q_1$, and may be zero-mean, binary-valued sequence.

Next, the equation (7) may be rewritten as the following equation (8):

$$R_i \approx W_{ic}^I + \Delta b_1 \times W_i^I + \Delta b_2 \times W_i^{II} + \Delta b_3 \times W_i^{III} + \Delta b_4 \times W_i^{IV} + \ldots \quad (8).$$

where $\Delta b_k = b_k - \tilde{b}_k$,
$W_{ic}^I = E\{q_2 \times D_y^c\}$, and
$W_i^I = E\{q_2 \times D_y\}$, $W_i^{II} = E\{q_2 \times D_y^2\}, \ldots$.

Furthermore, assuming that the voltage generating unit 240 provides the reference signal $V_{ref}$ to the switching circuit 220$_j$, and not the switching circuit 220$_i$, and provides the common signal $V_{com}$ to the other switching circuits (i.e. the switching circuits 220$_1$-220$_n$ except for the switching circuit 220$_j$) during the hold mode, $R_j$ may be calculated and expressed as the following equation (9):

$$R_j \approx W_{jc}^I + \Delta b_1 \times W_j^I + \Delta b_2 \times W_j^{II} + \Delta b_3 \times W_j^{III} + \Delta b_4 \times W_j^{IV} + \ldots \quad (9).$$

Moreover, assuming that the voltage generating unit 240 provides the reference signal $V_{ref}$ to both the switching circuits 220$_i$ and 220$_j$, and provides the common signal $V_{com}$ to the other switching circuits (i.e. the switching circuits 220$_1$-220$_n$ except for the switching circuits 220$_i$ and 220$_j$) during the hold mode, $R_t$ may be calculated and expressed as the following equation (10):

$$R_t \approx W_{tc}^I + \Delta b_1 \times W_t^I + \Delta b_2 \times W_t^{II} + \Delta b_3 \times W_t^{III} + \Delta b_4 \times W_t^{IV} + \ldots \quad (10).$$

The following equation (11) may be calculated according to the equations (8), (9) and (10) due to linearity:

$$R_t - (R_i + R_j) = 0 \approx H_{tc}^I + \Delta b_1 \times H_t^I + \Delta b_2 \times H_t^{II} + \Delta b_3 \times H_t^{III} + \Delta b_4 \times H_t^{IV} + \ldots \quad (11).$$

where $H_{tc}^I = W_{tc}^I - (W_{ic}^I + W_{jc}^I)$.
$H_t^I = W_t^I - (W_i^I + W_j^I)$.
$H_t^{II} = W_t^{II} - (W_i^{II} + W_j^{II})$.

As described above, any $R_t$ may be obtained by selecting two different switching circuits from the switching circuits 220$_1$-220$_n$. Then, the calibration processor 260 may obtain the difference $\Delta b$ by solving the simultaneous and different equations (11) to calibrate nonlinearity caused by the buffer 230. For example, solving two different equations (11) may obtain $\Delta b_2$ and $\Delta b_3$ thus compensating nonlinearity caused by the second order and the third order factors of the above equations.

Furthermore, the voltage generating unit 240 provides the reference signal $V_{ref}$ to the switching circuits 220$_1$-220$_n$ according to a sequence. In one embodiment, the voltage generating unit 240 may sequentially provide the reference signal $V_{ref}$ to the switching circuits 220$_1$-220$_n$ during a period of time T which comprises a plurality of sub-time periods. For example, the voltage generating unit 240 may provide the reference signal $V_{ref}$ to the switching circuit 220$_1$ during a sub-time period $t_1$ which may comprise a plurality of clock cycles of the signal $\phi_2$ shown in FIG. 3A or 3B, and provides the common signal $V_{com}$ to the switching circuits 220$_2$-220$_n$. Next, the voltage generating unit 240 may provide the reference signal $V_{ref}$ to the switching circuit 220$_2$ during a sub-time period $t_2$, and provides the reference signal $V_{ref}$ to the switching circuit 220$_3$ during a sub-time period $t_3$ and so on, where the length of $t_1$ to $t_n$ may be the same. In another embodiment, the voltage generating unit 240 may provide the reference signal $V_{ref}$ to the switching circuits 220$_1$-220$_n$ during the period of time T. For example, the voltage generating unit 240 provides the reference signal $V_{ref}$ to the switching circuit 220$_3$ during the sub-time period $t_1$, to the switching circuit 220$_n$ during the sub-time period $t_2$, and to the switching circuit 220$_1$ during the sub-time period $t_3$. In another embodiment, the voltage generating unit 240 may simultaneously provide the reference signal $V_{ref}$ to more than one switching circuit during a sub-time period. For example, the voltage generating unit 240 provides the reference signal $V_{ref}$ to the switching circuits 220$_1$ and 220$_2$ during the sub-time period $t_1$ and to the switching circuits 220$_3$ and 220$_4$ during the sub-time period $t_2$.

In this invention, a sequence or amount of the reference signal $V_{ref}$ provided to the switching circuits of a track and hold amplifier may be determined or adjusted according to accuracy and design of an A/D converter, and may be the same or not. Furthermore, the period, duty cycle or amplitude of the reference signal $V_{ref}$ may also be determined or adjusted, and may be the same or not. Moreover, in one embodiment, all capacitors of a track and hold amplifier may have the same capacitances or not.

Figure 4:
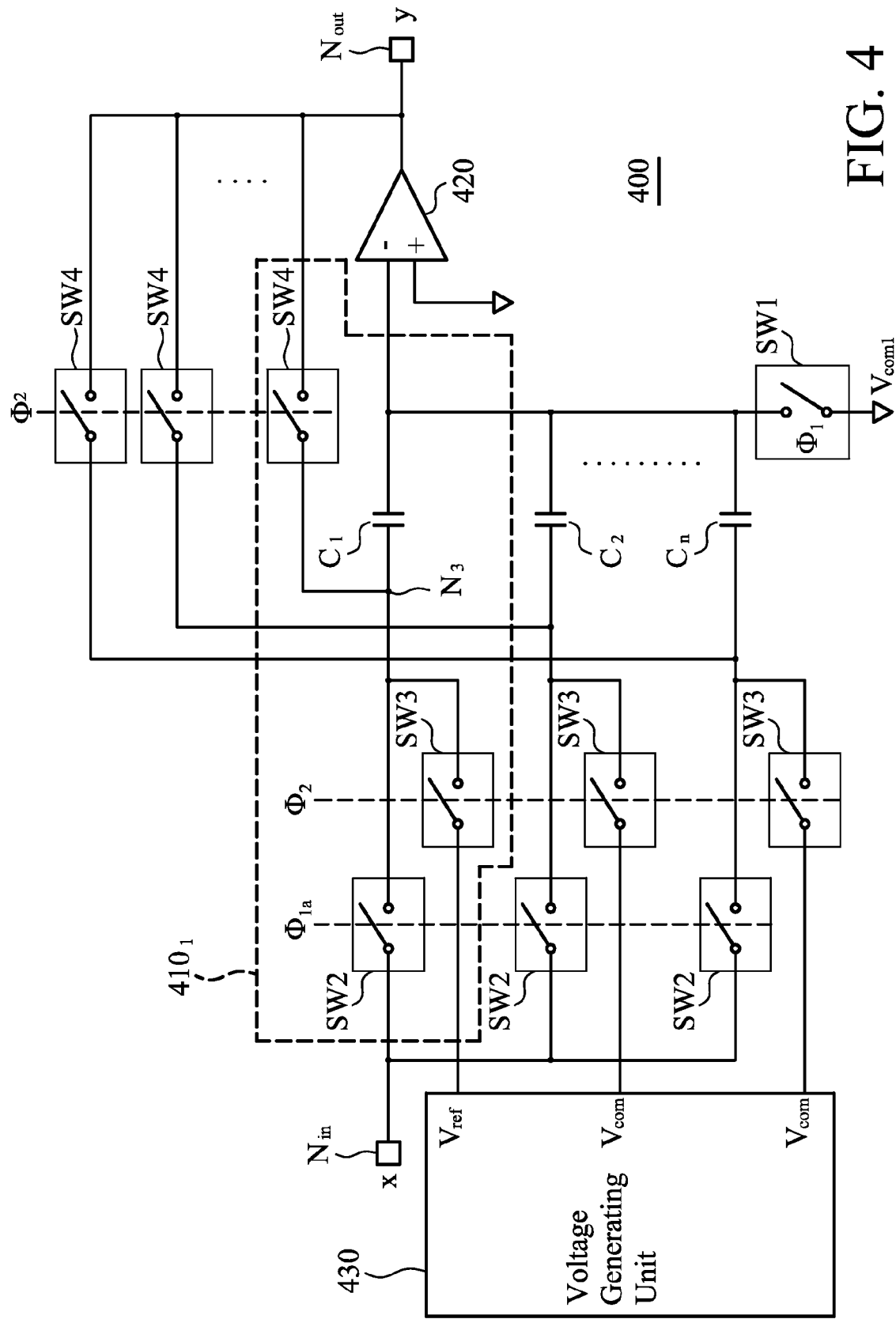
FIG. 4 shows a track and hold amplifier according to another embodiment of the invention.

FIG. 4 shows a track and hold amplifier 400 according to another embodiment of the invention. The track and hold amplifier 400 is a closed-loop circuit, which comprises a switch SW1, a plurality of switching circuits, an amplifier 420 and a voltage generating unit 430. The switch SW1 is coupled between a common node and an inverting input node of the amplifier 420, and the switch SW1 may be controlled by the signal $\phi_1$ shown in FIG. 3A or 3B. Each of the switching circuits is coupled between a node $N_{in}$ for receiving the analog input signal x and the inverting input node of the amplifier 420. The switching circuits may have similar architectures and each may comprise a capacitor and three switches. Using the switching circuit 410$_1$ as an example, the switching circuit 410$_1$ comprises a capacitor $C_1$ coupled between a node $N_3$ and the inverting input node of the amplifier 420, a switch SW2 coupled between the node $N_{in}$ and the node $N_3$, a switch SW3 coupled between the node $N_3$ and the voltage generating unit 430, and a switch SW4 coupled between the node $N_3$ and an output node $N_{out}$.

In the track and hold amplifier 400, each of the switches SW2 may be controlled by the signal $\phi_{1a}$ as shown in FIG. 3A or 3B, and each of the switches SW3 and SW4 may be controlled by the signal $\phi_2$ as shown in FIG. 3A or 3B, hence the switches SW3 and SW4 may be synchronous. In addition, a non-inverting input node of the amplifier 420 is coupled to the common node, and an output of the amplifier 420 is coupled to the output node $N_{out}$. Similarly, the voltage generating unit 430 selectively provides the common signal $V_{com}$ and the reference signal $V_{ref}$ to the switching circuits, and may provide the reference signal $V_{ref}$ to the switching circuits according to the sequence as described previously. A voltage of the common signal $V_{com}$ may either be equal to a voltage provided by the common node $V_{com1}$ or not.

Figure 5:
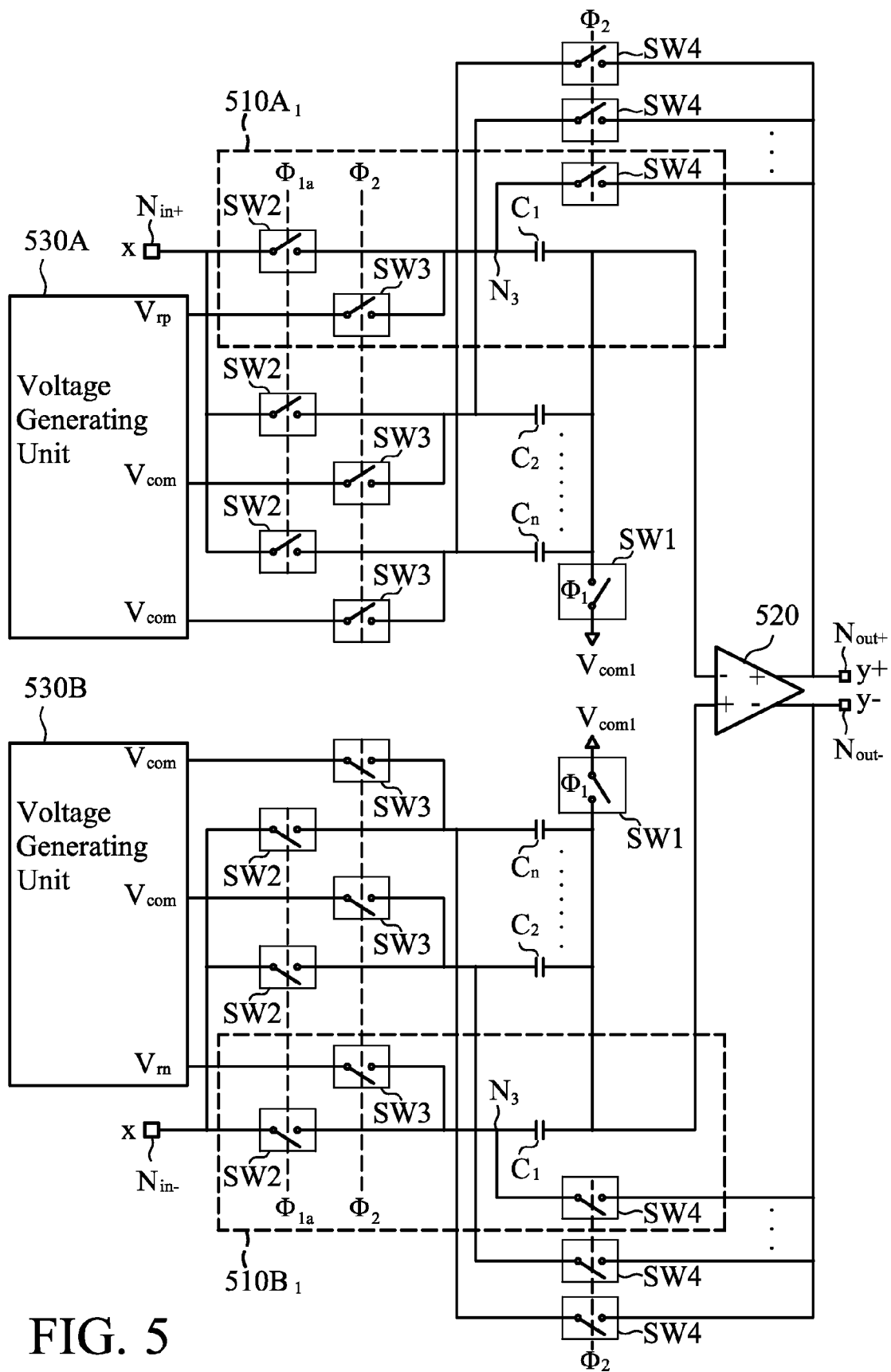
FIG. 5 shows a track and hold amplifier according to another embodiment of the invention.

FIG. 5 shows a track and hold amplifier according to another embodiment of the invention. The track and hold amplifier is a closed-loop circuit comprising two switches SW1, a plurality of switching circuits, an amplifier 520 and two voltage generating unit 530A and 530B. Compared to the amplifier 420 of FIG. 4, the amplifier 520 is a fully differential amplifier. Furthermore, using the switching circuits $510A_1$ and $510B_1$ as illustration, the switching circuit $510A_1$ is coupled between a node $N_{in+}$ for receiving the analog input signal x and the inverting input node of the amplifier 520, and the switching circuit $510B_1$ is coupled between a node $N_{in-}$ for receiving the analog input signal x and the non-inverting input node of the amplifier 520. In addition, the non-inverting and inverting outputs of the amplifier 520 are coupled to the output nodes $N_{out+}$ and $N_{out-}$, respectively. The voltage generating unit 530A selectively provides the common signal $V_{com}$ and a reference signal $V_{rp}$ to the switching circuits coupled to the node $N_{in+}$, and the voltage generating unit 530B selectively provides the common signal $V_{com}$ and a reference signal $V_{rn}$ to the switching circuits coupled to the node $N_{in-}$. In this embodiment, the track and hold amplifier may track and hold the analog input signal x to generate two sampled signals y+ and y–. Then, a successional quantizer (not shown) may quantize the sampled signal y+ or y– to generate a digital signal $D_y$, as described above.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A track and hold amplifier, comprising:
    an input node receiving an analog signal;
    a buffer coupled between a first node and an output node;
    a first switch coupled between the input node and the first node;
    a plurality of switching circuits, each comprising a capacitor coupled between the first node and a second node; and
    a voltage generating unit selectively providing a common signal and a reference signal to the capacitors of the switching circuits, wherein the reference signal is independent from the analog signal and the common signal.

2. The track and hold amplifier as claimed in claim 1, wherein each of the switching circuits comprises:
    a second switch coupled between the second node and a common node; and
    a third switch coupled between the second node and the voltage generating unit;
    wherein the second switch is turned on and the third switch is turned off when the first switch is turned on, and the first switch and the second switch are turned off when the third switch is turned on.

3. The track and hold amplifier as claimed in claim 2, wherein the voltage generating unit provides the reference signal to one of the switching circuits and provides the common signal to the switching circuits other than the one of the switching circuits when corresponding third switches are turned on.

4. The track and hold amplifier as claimed in claim 2, wherein the common signal has a voltage level equal to that of the common node.

5. The track and hold amplifier as claimed in claim 1, wherein the voltage generating unit provides the reference signal to the switching circuits during a period of time according a specific sequence, and the period of time comprises a plurality of sub-time periods.

6. The track and hold amplifier as claimed in claim 5, wherein the voltage generating unit provides the reference signal to one of the switching circuits and provides the common signal to the switching circuits other than the one of the switching circuits during the sub-time periods.

7. The track and hold amplifier as claimed in claim 1, wherein a summing capacitor value of the capacitors is a predetermined value.

8. The track and hold amplifier as claimed in claim 1, wherein the buffer is an amplifier with gain.

9. An analog to digital converter for converting an input signal to an output signal, comprising:
    a track and hold amplifier receiving the input signal to generate a sampled signal, and comprising:
        an input node receiving the input signal;
        a buffer coupled between a first node and an output node;
        a first switch coupled between the input node and the first node;
        a plurality of switching circuits, each comprising:
            a capacitor coupled between the first node and a second node;
            a second switch coupled between the second node and a common node; and
            a third switch coupled to the second node, wherein the second switch is turned on and the third switch is turned off when the first switch is turned on, and the first switch and the second switch are turned off when the third switch is turned on; and
        a voltage generating unit coupled to the third switch of each of the switching circuits, selectively providing a common signal and a reference signal to the third switches of the switching circuits, wherein the reference signal is independent from the analog signal and the common signal;
    a quantizer quantizing the sampled signal to generate a quantized signal; and
    a calibration processor calibrating the quantized signal to generate the output signal.

10. The analog to digital converter as claimed in claim 9, wherein the voltage generating unit provides the reference signal to one of the switching circuits and provides the common signal to the switching circuits other than the one of the switching circuits when the third switches are turned on.

11. The analog to digital converter as claimed in claim 9, wherein the voltage generating unit provides the reference signal to the switching circuits during a period of time according a specific sequence, and the period of time comprises a plurality of sub-time periods.

12. The analog to digital converter as claimed in claim 11, wherein the voltage generating unit provides the reference signal to one of the switching circuits and provides the common signal to the switching circuits other than the one of the switching circuits during the sub-time periods.

13. The analog to digital as claimed in claim 9, wherein a summing capacitor value of the capacitors is a predetermined value.

14. The analog to digital as claimed in claim 9, wherein the buffer is an amplifier with gain.

15. The analog to digital as claimed in claim 9, wherein the common signal has a voltage level equal to that of the common node.

16. A track and hold amplifier, comprising:
an input node receiving an analog signal;
an amplifier having a non-inverting input node coupled to a common node, an inverting input node and an output node;
a first switch coupled between the inverting input and the common node;
a plurality of switching circuits, each comprising:
   a capacitor coupled between the inverting input node and a first node;
   a second switch coupled between the first node and the input node;
   a third switch coupled to the first node; and
   a fourth switch coupled between the first node and the output node, wherein the third switch and the fourth switch are synchronous, and the third switch is turned off and the second switch is turned on when the first switch is turned on, and the first switch and the second switch are turned off when the third switch is turned on; and
a voltage generating unit coupled to the third switch of each of the switching circuits, selectively providing a common signal and a reference signal to the third switches of the switching circuits, wherein the reference signal is independent from the analog signal and the common signal.

17. The track and hold amplifier as claimed in claim 16, wherein the voltage generating unit provides the reference signal to one of the switching circuits and provides the common signal to the switching circuits other than the one of the switching circuits when the third switches are turned on.

18. The track and hold amplifier as claimed in claim 16, wherein the voltage generating unit provides the reference signal to the switching circuits during a period of time according a specific sequence, and the period of time comprises a plurality of sub-time periods.

19. The track and hold amplifier as claimed in claim 18, wherein the voltage generating unit provides the reference signal to one of the switching circuits and provides the common signal to the switching circuits other than the one of the switching circuits during the sub-time periods.

20. The track and hold amplifier as claimed in claim 16, wherein a summing capacitor value of the capacitors is a predetermined value.

21. The track and hold amplifier as claimed in claim 16, wherein the common signal has a voltage level equal to that of the common node.

22. An analog to digital converter for converting an input signal to an output signal, comprising:
a track and hold amplifier receiving the input signal to generate a sampled signal, and comprising:
   an input node receiving the analog signal;
   an amplifier having a non-inverting input node coupled to a common node, an inverting input node and an output node;
   a first switch coupled between the inverting input and the common node;
   a plurality of switching circuits, each comprising:
      a capacitor coupled between the inverting input node and a first node;
      a second switch coupled between the first node and the input node;
      a third switch coupled to the first node; and
      a fourth switch coupled between the first node and the output node, wherein the third switch and the fourth switch are synchronous, and the third switch is turned off and the second switch is turned on when the first switch is turned on, and the first switch and the second switch are turned off when the third switch is turned on; and
   a voltage generating unit coupled to the third switch of each of the switching circuits, selectively providing a common signal and a reference signal to the third switches of the switching circuits, wherein the reference signal is independent from the analog signal and the common signal; and
a quantizer quantizing the sampled signal to generate a quantized signal; and
a calibration processor calibrating the quantized signal to generate the output signal.

23. The analog to digital converter as claimed in claim 22, wherein the voltage generating unit provides the reference signal to one of the switching circuits and provides the common signal to the switching circuits other than the one of the switching circuits when the third switches are turned on.

24. The analog to digital converter as claimed in claim 22, wherein the voltage generating unit provides the reference signal to the switching circuits during a period of time according a specific sequence, and the period of time comprises a plurality of sub-time periods.

25. The analog to digital converter as claimed in claim 24, wherein the voltage generating unit provides the reference signal to one of the switching circuits and provides the common signal to the switching circuits other than the one of the switching circuits during the sub-time periods.

26. The analog to digital converter as claimed in claim 22, wherein a summing capacitor value of the capacitors is a predetermined value.

27. The analog to digital converter as claimed in claim 22, wherein the common signal has a voltage level equal to that of the common node.

* * * * *